THERMOELECTRIC SYSTEM WITH IMPROVED ENERGIZING NETWORK

Filed Feb. 27, 1967

Inventor
Harry J. Venema

By Peter S. Lucyshyn
Attorney

United States Patent Office 3,386,255
Patented June 4, 1968

3,386,255

THERMOELECTRIC SYSTEM WITH IMPROVED ENERGIZING NETWORK

Harry J. Venema, Wheaton, Ill., assignor to Borg-Warner Corporation, Chicago, Ill., a corporation of Illinois Filed Feb. 27, 1967, Ser. No. 618,965
3 Claims. (Cl. 62—3)

ABSTRACT OF THE DISCLOSURE

A thermoelectric system in which a D.-C. electric motor operated fan is used to a cool a thermoelectric module, and a third brush is provided in the electric motor to tap the required low voltage for energizing the thermoelectric module. This abstract shall not be used for interpreting the scope of the claims.

Figure 1:
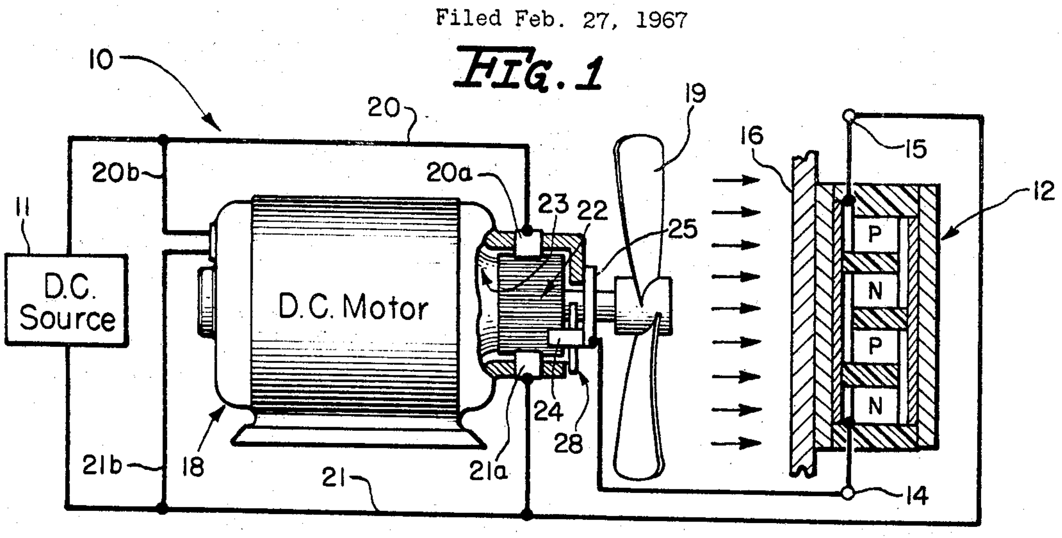

The present invention relates to a thermoelectric device and more particularly to a novel system for energizing a thermoelectric device.

*Brief summary of the invention*

The present invention is in a thermoelectric system energized by a D.-C. source and including a motor having a commutator to which the D.-C. source voltage is applied and a structure permitting tapping of less than the full source voltage and applying the reduced voltage to a thermoelectric module.

In particular instances utilizing thermoelectric devices, an arrangement must be provided to facilitate cooling of the devices. One arrangement includes the use of an electric motor operated fan for directing a stream of air at the thermoelectric module thereby effecting heat removal by mass transport. (See Chartouni, U.S. Patent No. 3,254,494, issued June 7, 1966.)

The energy requirements of the thermoelectric module and the fan motor are different. The thermoelectric module is a low impedance device which draws a large current, whereas the motor has a relatively higher impedance, and thereby with application of the same voltage draws less current. Describing an exemplary installation for comparison purposes, one thermoelectric system of the above type was energized by a system operating from a 12 volt D.-C. supply. The voltage of 12 volts D.-C. was desirable to operate the motor, however, it had to be reduced to one volt to provide the proper voltage across the thermoelectric module. When one volt is applied across the module, 35 to 40 amperes are drawn by the latter.

To reduce the voltage fed into a thermoelectric module, as required in the exemplary instance above, one of several methods are used by the prior art. For example, a Variac transformer or autotransformer has been used to lower the voltage of an A.-C. source, the reduced voltage then being rectified and the desired D.-C. signal fed to the thermoelectric module. A resistor having a slide has been used to tap a portion of the input voltage. If the input voltage is an A.-C. signal, then a rectifier is necessary to invert the signal to a D.-C. voltage. A solid state chopper is yet another device usable to lower an A-C. input voltage, thereafter the signal is rectified before being fed into the thermoelectric module. Clearly, each of the above devices for reducing the voltage to the necessary level for feeding into the thermoelectric device adds to the cost and maintenance of the thermoelectric system.

Accordingly, it is an object of the present invention to provide a novel simplified structure in combination with a D.-C. motor for energizing a thermoelectric module by eliminating the need for equipment heretofore used in reducing the level of the source voltage prior to feeding the latter to the thermoelectric module.

A more detailed object of the present invention is to provide an improved D.-C. fan motor construction, generally of the type presently used for cooling the thermoelectric module, but so arranged as to supply the relatively lower voltage necessary for energizing a thermoelectric module.

It is an overall object of the present invention to provide an improved energizing network for a thermoelectric module which is simple and economical to manufacture and has less maintenance than networks heretofore used.

Figure 2:
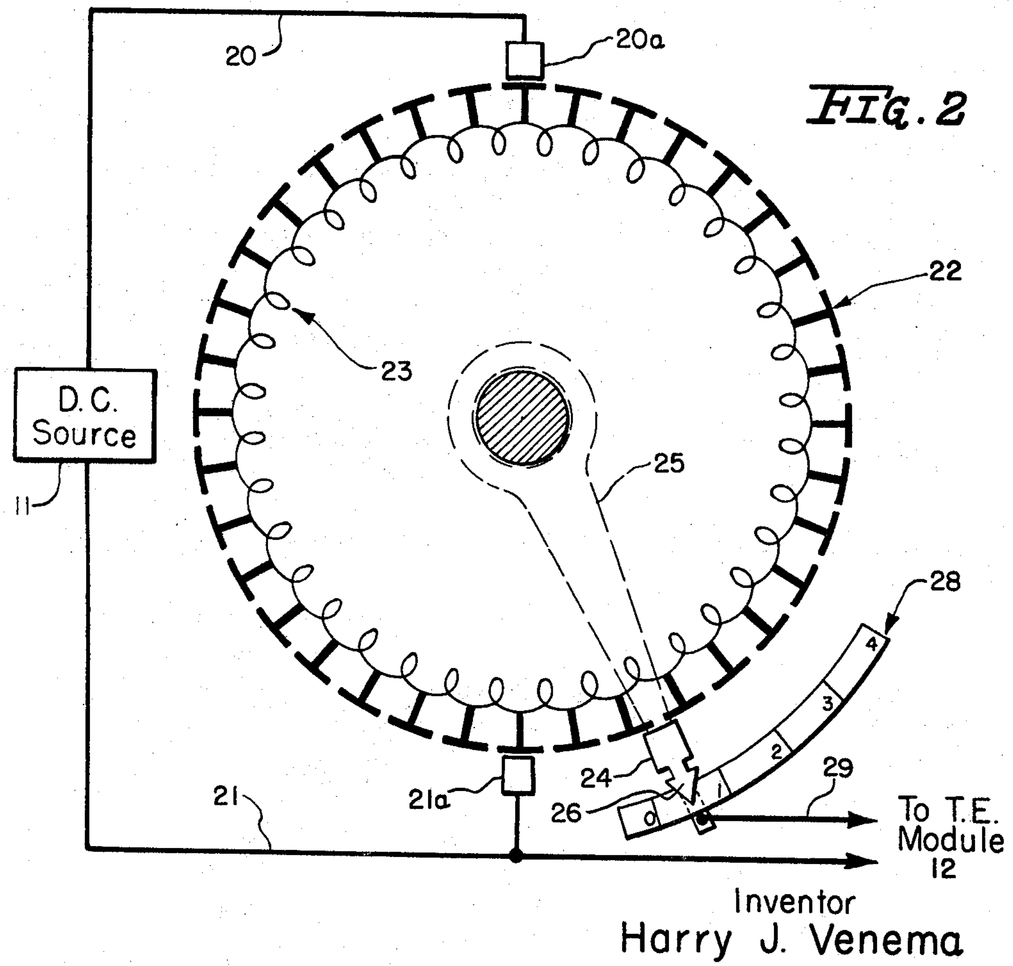

The above and other objects and advantages of the present invention will be more readily apparent when read in connection with the accompanying drawings in which:

FIGURE 1 is a diagrammatic representation of a thermoelectric system embodying the present invention; and FIGURE 2 is a schematic of a thermoelectric module energizing network in the system of FIGURE 1.

Turning to FIGURE 1, thereshown is a thermoelectric system 10 energized by a D.-C. source 11 embodying the present invention. The system 10 includes a thermoelectric module 12 which is constructed in a manner well known in the art with a plurality of semi-conductor P and N materials connected in series. A pair of terminals 14, 15 extend from the module 12 to provide connection points for energizing the module. Along one side of the module there is provided a heat sink forming wall 16. For directing a stream of air toward the wall 16 and thereby effect removal of heat from the latter by mass transport, a motor 18 energized by the D.-C. source 11 is provided with a fan 19 oriented to direct a stream of air at the wall 16. The D.-C. source 11 is applied to a pair of terminals 20, 21 coupled to a set of rotor windings 23 by a commutator 22, in the present instance through a pair of respective brushes 20*a*, 21*a*, and to a motor field (not shown) by conductors 20*b*, 21*b*. D.-C. energy is thereby transmitted to the motor 18 in a manner well known in the art.

In accordance with the present invention, means are provided for selecting a portion of the voltage applied to the commutator 22 of the motor 18 and transmitting that voltage to the thermoelectric module 12. It is necessary to tap a portion or fraction of the D.-C. source 11 in energizing the thermoelectric module 12 because the latter is a low impedance device as compared to the D.-C. motor 18. As an example, a source voltage of 12 volts would be proper for energizing the motor 18, however, it would be much too great for the thermoelectric module 12. The required voltage for the latter is approximately one volt.

As herein illustrated the tapping means is a third brush 24 slidably carried by a suitable support 25 so that the brush 24 can be moved along the periphery of commutator bars 22. As best shown in FIGURE 2, as the brush 24 is moved clockwise a larger portion of the D.-C. source voltage is tapped off by the brush. In the exemplary embodiment, a pointer 26 moving along a scale 28 shows the fractional portion of the full source voltage that is tapped by the third brush 24 and transmitted by a conductor 29 to the thermoelectric module terminal 14. Thus the third brush 24 can be easily positioned to tap off the desired portion of the voltage supplied by the D.-C. source 11. If an adjustable voltage is not required for energizing the thermoelectric module, then of course the structure permitting tapping of different voltages is unnecessary. The conductor 29 is coupled to a stationary tapping means which provides the desired fractional voltage.

The rotor windings must be constructed so as not to overheat when carrying both the large current required by the thermoelectric module as well as the motor current. The current which is tapped by third brush 24 must travel through a portion of the motor 18. It is also necessary to provide brushes and commutators of ample capacity or size in order to be able to withstand the relatively high currents flowing therethrough while the motor is being used as an electromechanical transducer, both driving the fan 19 and functioning as an electrical power converter. As a result, the total size of the motor 18 is increased as the number of ampere-turns per inch in the rotor is increased.

It is clear from the foregoing that the present invention provides a simple system for reducing voltage to be applied to a thermoelectric module. The motor which is ordinarily used to cool the thermoelectric module can be adapted to act as a voltage transformer to provide the required voltage for a thermoelectric module. The present system is simple to manufacture and easy to maintain and will find special application where portable D.-C. energizing thermoelectric modules are used.

While I have described my invention in connection with one specific embodiment, it is to be understood that this is by way of illustration and not by way of limitation and the scope of my invention is defined solely by the appended claims which should be construed as broadly as the prior art will permit.

I claim as my invention:

1. In a thermoelectric system adapted to be energized from a D.-C. source, the combination comprising a D.-C. motor driving a fan and having a commutator, means for applying the D.-C. source to said commutator, a thermoelectric module, means coupled to said motor commutator effective to select a portion of the D.-C. source voltage, and means for applying said selected portion of said source voltage to said thermoelectric module.

2. In a thermoelectric system energized by a D.-C. source the combination comprising a motor, a commutator on said motor carrying a pair of brushes, the D.-C. source being applied to said brushes, a thermoelectric module, a third brush carried by said motor commutator, said third brush being movable between said first pair of brushes to select a fractional portion of the D.-C. source voltage, and means for coupling said third brush to said thermoelectric module to permit feeding of said fractional portion of the D.-C. source voltage to said module.

3. In a thermoelectric system energized by a D.-C. source the combination comprising a motor for driving a fan, a commutator carrying a pair of brushes, the D.-C. source applied across said brushes, a thermoelectric module, said motor driven fan being positioned to direct a stream of air toward said module to effect removal of heat therefrom, a third brush also carried by said motor commutator and being movable between said first pair of brushes to select a fractional portion of the D.-C. source voltage, and means coupling said third brush to said thermoelectric module to permit feeding of said fractional portion of the D.-C. source voltage to said module.

References Cited

UNITED STATES PATENTS

| | | | |
|---|---|---|---|
| 664,776 | 12/1900 | Porter | 62—3 |
| 3,004,393 | 10/1961 | Alsing | 62—3 |
| 3,019,609 | 2/1962 | Pietsch | 62—3 |
| 3,070,964 | 1/1963 | Horvax | 62—3 |

WILLIAM J. WYE, *Primary Examiner.*